United States Patent [19]

Reinagel

[11] Patent Number: 4,881,162

[45] Date of Patent: Nov. 14, 1989

[54] FREQUENCY CONTROL SYSTEM

[75] Inventor: Frederick G. Reinagel, Erie, N.Y.

[73] Assignee: LTV Aerospace & Defense Co., Dallas, Tex.

[21] Appl. No.: 168,447

[22] Filed: Mar. 15, 1988

[51] Int. Cl.$^4$ .......................... H03B 9/10; H01J 25/50
[52] U.S. Cl. ...................................... 364/176; 331/90; 315/39.55
[58] Field of Search ..................... 364/176; 331/86–90; 315/39.55

[56] References Cited

U.S. PATENT DOCUMENTS 4,636,750 1/1987 England .................................. 331/90
4,748,424 5/1988 England .................................. 331/87

Primary Examiner—Allen MacDonald
Attorney, Agent, or Firm—Brooks & Kushman

[57] ABSTRACT

A frequency control system is provided for controlling the radio frequency of a mechanically tuned coaxial magnetron under a wide variety of environmental conditions by initially tuning the magnetron according to resident tuning data and in response to a received frequency command signal, directly measuring the frequency of the magnetron output, comparing the frequency command signal with the actual frequency of each of a series of sampled output pulses, modifying a dynamically adapting calibration function according to any differences found during the comparison, retuning the magnetron according to the modified calibration function, and repeating the process to maintain the magnetron output frequency in agreement with frequency command signals. The coefficients of the calibration function converge to an optimum set of values within a few pulses. Frequency offset can be effectively corrected with the measurement of one pulse; and other frequency control characteristics, such as slope and nonlinearity, can be corrected with the measurement of but a few more at different frequencies.

34 Claims, 2 Drawing Sheets

FREQUENCY CONTROL SYSTEM

TECHNICAL FIELD

This invention relates to systems that control the frequency of mechanically tuned coaxial magnetrons or the like.

BACKGROUND ART

A coaxial magnetron is a thermionic vacuum tube device having a cathode coaxially disposed with respect to an associated anode. Electrons are emitted by the heated cathode and are accelerated toward the anode by an electric field created by a high voltage applied between the cathode and the anode. The interelectrode space is traversed by a magnetic field created by externally disposed permanent magnets or electromagnets. The magnetic field acts transversely to the cathode-to-anode path such that the emitted electrons are deflected by the field. When properly connected to a resonant line, the magnetron tube can operate as an oscillator and be made to generate frequencies measured in thousands of megaHertz and having associated wavelengths of a few centimeters.

The output frequencies of magnetron tubes depend on a number of factors ranging from mechanical variations incurred during their manufacture to environmental variations occurring during their subsequent use. Since some magnetron tube applications require fixed-frequency operation and other applications require specifically controlled, variable-frequency or multiple-frequency operation, provision must be made for tuning the tubes.

The conventional method for controlling the frequency of a mechanically tuned coaxial magnetron is by operably coupling a position servo control loop to a moveable tuning member. Since specified frequencies must be set and maintained under a wide variety of environmental conditions, a number of problems attend this method.

One major problem arises from the fact that the tuning member position associated with a particular output frequency of one magnetron tube may not provide the same output frequency if another tube is substituted for the original. A possible solution to this problem would be to incorporate a data storage module in the assembly of each magnetron tube to store the characteristics of that tube so that, when the tube is substituted for another, the data could be used to compute the tuning member position for a desired output frequency. Locating a data storage module, comprising relatively low voltage digital circuits, near the high voltage and current transients attending an operating magnetron tube would invite additional problems, however.

Another major problem results from the temperature sensitivity of the tuner and of the associated tuning member position sensing device, and this problem is often addressed by placing critical components in constant-temperature ovens. Such ovens, however, must be operated at temperatures above the highest anticipated ambient temperature. Because the components must be closely coupled to the magnetron, which itself operates at substantially elevated temperatures, a significant reduction in reliability is unavoidable.

Additionally, some critical components, notably the tuning member, which is located inside the vacuum envelope of the magnetron tube, cannot be placed in an oven. Therefore, one or more temperature sensors must be located proximate these critical components and the outputs of the sensors used in conjunction with an error-correcting function to compensate for temperature caused frequency deviations. Since error-correcting functions will be somewhat different for each tube, a technique such as that previously described using stored tube characteristics, with its attending problems, must then be used to attempt to compensate for the differences in tube characteristics.

Another problem involves frequency pulling resulting from radio frequency load variations. An effective solution to this would be to insert a high-power ferrite load isolator between the magnetron and the antenna. The isolator would, of course, incur a radio frequency power loss; and an increase in magnetron output power would be required to compensate for this loss. This would require an increase in modulator output power, which, in turn, would require a greater power output from the high-voltage supply. All of this would require a greater cooling system capacity, which would consume even more power. Overall, this would result in a substantial reduction in system efficiency and significantly increase the size and cost of the system.

Yet another problem results from the long-term effects of component aging. The solution to this problem would be the periodic calibration and adjustment of electrical and mechanical trimmers, likely requiring specially trained personnel using special test equipment.

The present invention comprises an effective combination of elements that at once maximizes the speed, effectiveness and efficiency of controlling the frequency of a mechanically tuned coaxial magnetron while minimizing the cost, size and maintenance of the frequency control system.

DISCLOSURE OF THE INVENTION

In accordance with the present invention, a frequency control system is provided that requires little maintenance and that accurately, quickly and efficiently controls the frequency of a mechanically tuned coaxial magnetron under a wide variety of environmental conditions.

The preferred embodiment of the present invention contemplates a frequency control system that controls the radio frequency of a mechanically tuned coaxial magnetron by initially tuning the magnetron according to stored tuning data and in response to a received frequency command signal, directly measuring the magnetron output frequency using stable frequency reference components remotely located, with most other frequency control system components, in a relatively benign environment, comparing the frequency command signal with the actual frequency of sampled output pulses, modifying a dynamically adapting calibration function according to any differences found during the comparison, retuning the magnetron according to the modified calibration function, and repeating the process to maintain agreement between the magnetron output signal and frequency command signals.

BEST MODE FOR CARRYING OUT THE INVENTION

1. Principle of Operation

In principle, the present invention is an iterative device for controlling the frequency of a mechanically tuned coaxial magnetron and, upon receiving a frequency command, generates a first positioning signal, based on resident magnetron tuning data, that is used to move a magnetron tuning member to an initial position, senses and measures the magnetron output, compares its frequency with the frequency command, modifies, according to any detected difference, a resident dynamically adapting calibration function, generates a second positioning signal according to the modified calibration function, and repeats the process to maintain the magnetron output frequency in agreement with frequency command signals.

2. System Description

Figure 1:
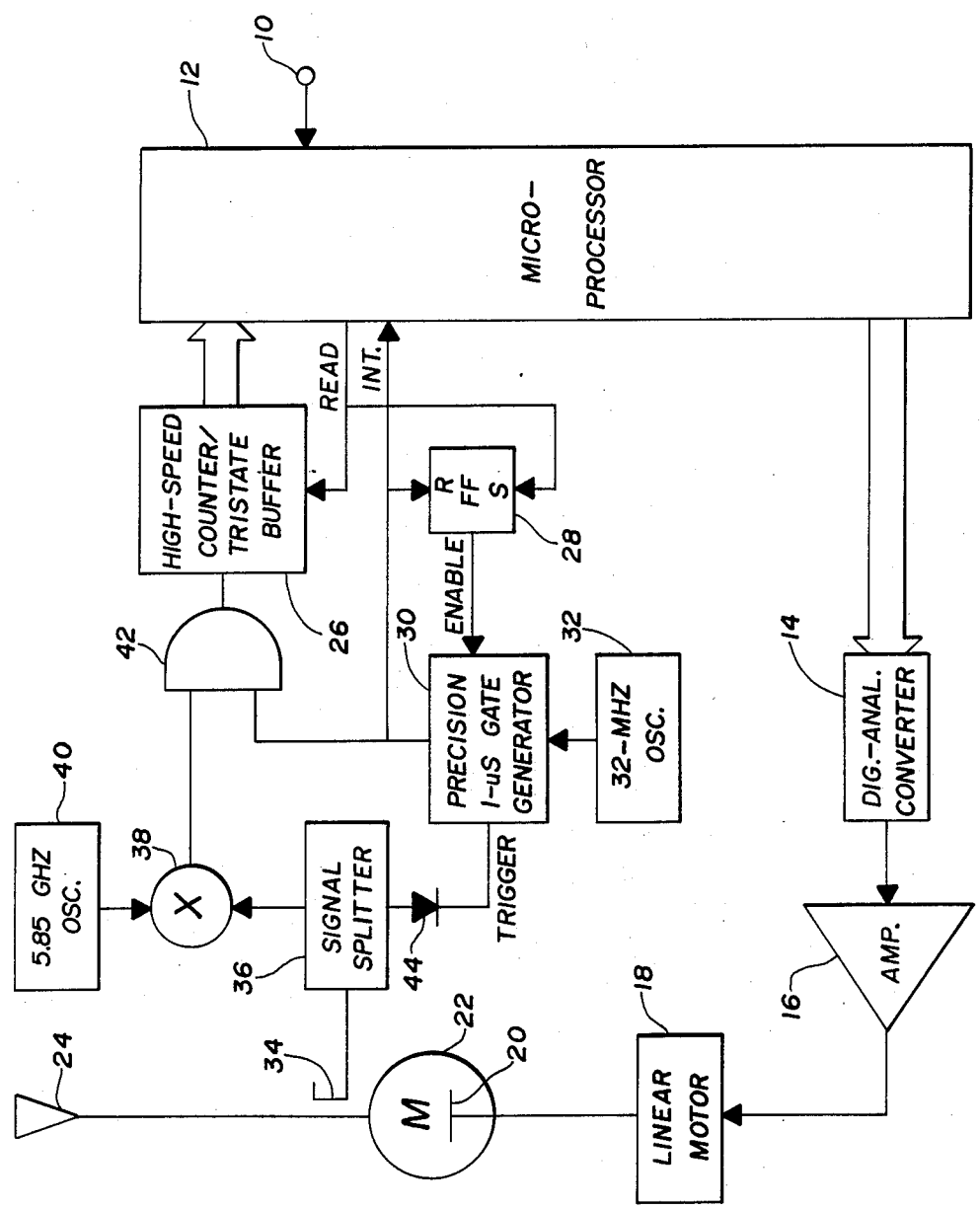
FIG. 1 is a schematic representation of the preferred embodiment of the frequency control system.

With reference to FIG. 1, shown is a schematic representation of a frequency control system for a mechanically tuned coaxial magnetron having an input terminal 10 connected to a first input of a programmable logic means, which may be a microprocessor, 12.

A first output of the microprocessor 12 is connected to a digital-to-analog converter 14, the output of which is connected to the input of an amplifier 16. The output of the amplifier 16 is connected to a driver means, which may be an electromechanical driver device, which, in turn, may be a linear electric motor, 18. The linear electric motor 18 is mechanically coupled to the tuning member 20 of a magnetron tube 22 the output of which is connected to an antenna 24.

A second output of the microprocessor 12 is connected to a first input of a measurement means, which may be a high-speed counter/tristate buffer, 26 and also to the SET input of a bistable device, which may be a flip-flop, 28. The output of the flip-flop 28 is connected to a first input of a precision gate generator 30. A precision oscillator, that may have a frequency reference component fabricated of quartz, 32 is also connected to the precision gate generator 30.

A sensor device, or electromagnetic transducer, 34 is effectively disposed to sample the output frequency of the magnetron 22 and is connected to a signal splitter 36. A first output of the signal splitter 36 is connected through a detector 44 to a second (TRIGGER) input of the precision gate generator 30, and a second output of the signal splitter 36 is connected to a first input of a frequency downconverter (mixer) 38. A stable, ovenized, dielectric resonator oscillator, that may have a frequency reference component fabricated of ceramic, 40, located at a distance from the magnetron 22 sufficient to isolate it from the high voltage and current transients associated with the magnetron 22, is connected to a second input of the frequency downconverter 38.

The output of the frequency downconverter 38 and the output of the precision gate generator 30 are respectively connected to first and second inputs of an AND gate 42. The output of the precision gate generator 30 is also connected to the RESET input of the flip-flop 28 and to a second input of the microprocessor 12. The output of the AND gate 42 is connected to a second input of the high-speed counter/tristate buffer 26 the output of which is connected to a third input of the microprocessor 12.

Since logic circuits are vulnerable to high voltage and current transients, except for the linear motor 18 and the electromagnetic transducer 34, all elements of the frequency control system are located at a distance from the magnetron 22 sufficient to isolate them from the high voltage and current transients associated therewith.

3. Operation

Figure 2:
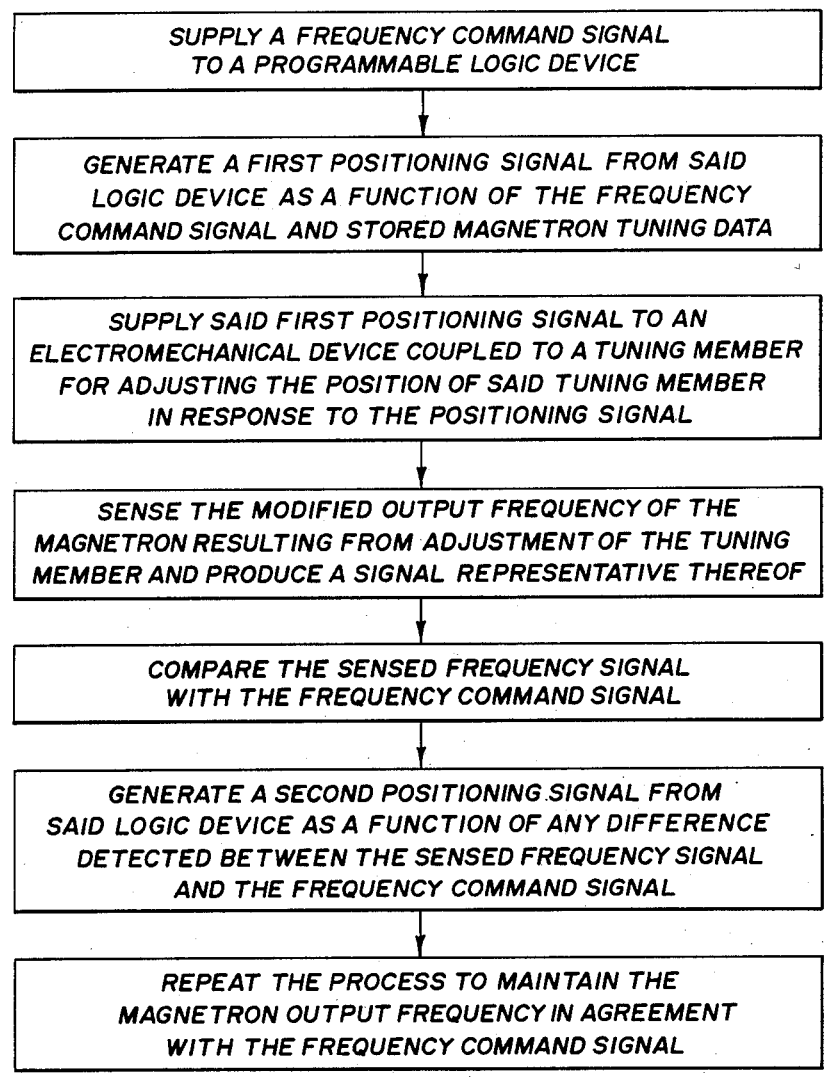
FIG. 2 illustrates the steps of the preferred method for tuning a magnetron using the device of FIG. 1.

With reference to FIG. 2, shown are the steps of a preferred method for controlling the frequency of a magnetron using the device of FIG. 1. In operation, a preselected, digitally formatted, frequency command is sent to the first input of the microprocessor 12 via the input terminal 10. Resident in the microprocessor 12 are data defining a best-estimate curve representing the tuning characteristics, as expressed in output frequency versus linear motor current, of the magnetron tube 22. In response to the frequency command, the microprocessor 12 generates a signal, based on the best-estimate curve, that, after being converted from digital to analog format by the converter 14 and amplified by the amplifier 16, is used to energize the linear electric motor 18 such that it will set the tuning member 20 to an initial position that is nominally appropriate for tuning the magnetron tube 22 to the frequency desired.

A sample of the output signal from the magnetron tube 22 is coupled via the output sensing device 34 to the signal splitter 36 and is coupled to the frequency downconverter 38. The sample output signal is mixed with a 5.85-gigaHertz signal from the ovenized dielectric resonator oscillator 40 to produce a more readily countable intermediate frequency signal having a frequency between 100 and 600 megaHertz, and the latter signal is coupled to the first input of the AND gate 42.

The output signal sample is also coupled from the signal splitter 36, through a detector 44, to the precision gate generator 30. The quartz crystal oscillator 32 produces a 32-megaHertz signal that is coupled to the precision gate generator 30. The leading edge of the incoming signal pulse from the detector 44 triggers the gate generator 30, which produces a signal that is coupled to and enables the second input of the AND gate 42. The precision gate generator 30 incorporates a counter that enables the gate 30 upon receiving a pulse from the quartz crystal oscillator 32 immediately following the triggering signal from the detector 44, and disables the gate 30 after exactly thirty-two pulses from the quartz crystal oscillator 32 have been counted. Since thirty-two pulses of a 32-megaHertz signal represent a period of one microsecond, an enabling signal from the precision gate generator 30 will be applied to the second input of the AND gate 42 for precisely one microsecond.

Every pulse coupled from the frequency downconverter 38 to the first input of the AND gate 42 will enable the gate 42 during the one-microsecond period the second input thereof is receiving the enabling signal from the precision gate generator 30, and output pulses coincident to those from the frequency downconverter 38 will be coupled from the AND gate 42 to the high-speed counter 26. Since the period during which the pulses are coupled to the counter 26 is one microsecond, the number of pulses counted will correspond directly to the AND gate output signal frequency in megaHertz.

For example, a count change of 250 would correspond to a frequency of 250 megaHertz.

When the precision gate generator 30 is enabled, the output signal therefrom is also coupled to the RESET input of the flip-flop 28, resetting the latter. The output of the reset flip-flop 28 is coupled to the first (ENABLE) input of the precision gate generator 30, preventing the gate 30 from exporting another output signal to enable the AND gate 42 as long as the flip-flop 28 is reset.

When the precision gate generator 30 is enabled and triggered, the output signal therefrom is also coupled to the second input of the microprocessor 12, which interprets it as an INTERRUPT signal informing it that it should read the number counted and stored by the counter 26 through the tristate buffer associated therewith. When it is ready, the microprocessor 12 produces a READ signal that is coupled from the second output of the microprocessor 12 to the first input of the counter 26 and also to the SET input of the flip-flop 28, setting it, the output of the SET flip-flop being coupled to the first input of the precision gate generator 30, enabling it to produce another one-microsecond signal when it is triggered by the leading edge of the next pulse sampled from the output of the magnetron 22.

Under control of the microprocessor 12, a signal representing the count stored in the counter 26 is coupled from the output thereof to the third input of the microprocessor 12. The count read is subtracted from the previous count to obtain an advancing count change that is compared to the frequency command signal associated with the magnetron output frequency just sampled.

Any detected difference indicates that the best-estimate curve resident in the microprocessor 12 was not accurate; and the dynamically adapting calibration function is modified accordingly. The tuning member 20 is repositioned by the linear motor 18, under the direction of an associated curve-fitting algorithm resident in the microprocessor 12; and the frequency of the output signal of the magnetron 22 is again sampled. By this time, the frequency error will have been significantly reduced. The process is repeated, correcting and maintaining the frequency and other characteristics of the magnetron output in accordance with set or changing frequency command signals.

The coefficients of the calibration function converge to an optimum set of values within a few pulses. Frequency offset can be effectively corrected with the measurement of one pulse; and other frequency control characteristics, such as slope and nonlinearity, can be corrected with the measurement of but a few more at different frequencies.

What is claimed is:

1. A frequency control system for controlling, under a wide variety of environmental conditions, the output frequency of a coaxial magnetron having a mechanically positionable tuning member, said frequency control system comprising:

programmable logic means, responsive to a frequency command signal, for generating a positioning signal derived from the frequency command signal, where the initial value of the positioning signal is functionally related to stored nominal magnetron tuning data;

driver means, intercoupling the programmable logic means and the tuning member of the magnetron, for positioning the tuning member in response to positioning signals generated by said programmable logic means;

sensor means, responsive to the output of the magnetron for sensing the output of the magnetron and producing a signal representative thereof;

measurement means, connected to said sensor means, for measuring the frequency of the sensor output signal and supplying a feedback signal to the programmable logic means; and said programmable logic means being operative to compare the frequency command signal with the frequency of the sampled magnetron output, modify a resident dynamic calibration function according to any difference detected in the comparison, and generate a revised positioning signal based on the modified calibration function to thereby iteratively tune the output frequency of the coaxial magnetron.

2. A frequency control system according to claim 1 wherein said programmable logic means comprises a microprocessor capable of receiving, storing and manipulating data.

3. A frequency control system according to claim 2 wherein said driver means comprises an electromechanical driver device.

4. A frequency control system according to claim 3 wherein said electromechanical driver device comprises a linear electric motor.

5. A frequency control system according to claim 4 further including:

an amplifier connected to said linear motor for energization of said motor; and a digital-to-analog converter connected between said amplifier and said microprocessor for converting digital control signals from said microprocessor to analog signals for introduction to said amplifier.

6. A frequency control system according to claim 5 wherein said sensor means comprises an electromagnetic transducer.

7. A frequency control system according to claim 6 wherein said measurement means comprises a high-speed counter 8. A frequency control system according to claim 7 further including:

a signal splitter connected to said electro-magnetic transducer for supplying, from two outputs of said signal splitter, a sample of the magnetron output signal obtained by said electromagnetic transducer;

a precision gate generator connected to a first of the two outputs of said signal splitter;

a bistable device connected to said precision gate generator to enable said precision gate generator under control of said microprocessor;

a frequency downconverter connected to the second of the two outputs of said signal splitter;

an oscillator connected to said frequency downconverter, the output signal from said oscillator and the sample magnetron output signal from said signal splitter being mixed by said frequency downconverter to produce an intermediate-frequency signal;

a logical AND gate having two inputs, the first input being connected to said frequency down-converter to receive therefrom the intermediate-frequency signal, the second input being connected to the output of said precision gate generator to receive therefrom a pulse having a precisely timed duration;

said AND gate providing an output signal having a frequency equal to that of the intermediate-frequency signal and having a duration, defining a counting equal, to that of the signal generated by said precision gate generator;

said high-speed counter being connected to the output of said AND gate to receive therefrom a signal equal in frequency to that of the intermediate-frequency signal;

said counter counting the pulses of the output signal from said AND gate during the time the latter is enabled, the count being proportional to the frequency of the magnetron output signal, the output of said high-speed counter being connected to said microprocessor;

the leading edge of the first pulse of the sample magnetron output signal triggering said precision gate generator to begin generating an output signal to enable said AND gate, the output signal of said precision gate generator resetting said bistable device and thus prohibiting said precision gate generator from generating another signal until said bistable device is again set under control of said microprocessor;

the output signal of said precision gate generator also acting as an interrupt signal to inform said microprocessor that said high-speed counter is beginning to count the pulses of the output signal from said AND gate; and said microprocessor consequently reading the pulse count of said high-speed counter after the completion of the counting interval, the count being a functional measure of the frequency of the magnetron output signal.

9. A frequency control system according to claim 8 wherein said bistable device is a flip-flop.

10. A frequency control system according to claim 9 wherein said signal splitter is coupled to said precision gate generator through a detector.

11. A frequency control system according to claim 10 wherein said precision gate generator comprises a precision oscillator and a counter for counting the pulses of said precision oscillator, said precision gate generating an output signal having a duration equal to the time required by said counter to count a preselected number of precision oscillator output pulses.

12. A frequency control system according to claim 11 wherein the frequency reference component of said precision oscillator is a quartz crystal.

13. A frequency control system according to claim 12 wherein the frequency of said precision oscillator is 32 megaHertz.

14. A frequency control system according to claim 8 wherein said oscillator is an ovenized dielectric resonator oscillator.

15. A frequency control system according to claim 14 wherein the frequency reference component of said oscillator is fabricated of ceramic.

16. A frequency control system according to claim 15 wherein the frequency of said oscillator is 5.85 gigaHertz.

17. A frequency control system according to claim 8 further including a tristate buffer for interfacing the pulse count of said high-speed counter to said microprocessor, said microprocessor reading the pulse count through said buffer subsequent to being interrupted by receiving an output signal from said precision gate generator.

18. A frequency control system according to claim 8 wherein said microprocessor, said amplifier, said digital-to-analog converter, said high-speed counter, said signal splitter, said precision gate generator, said bistable device, said frequency down-converter, said oscillator connected to said frequency downconverter, said logical AND gate, and said high-speed counter are disposed at distances from the magnetron sufficient to isolate them from high voltage and current transients associated with the magnetron.

19. An iterative process for mechanically tuning a magnetron comprising the steps of:

supplying a frequency command signal to a programmable logic device;

generating a first positioning signal from said logic device as a function of the frequency command signal and stored magnetron tuning data;

supplying said first positioning signal to an electromechanical device coupled to a tuning member for adjusting the position of said tuning member in response to the positioning signal;

sensing the modified output frequency of the magnetron resulting from adjustment of the tuning member and producing a signal representative thereof;

comparing the sensed frequency signal with the frequency command signal;

generating a second position signal from said logic device as a function of any difference detected between the sensed frequency signal and the frequency command signal; and repeating the process to maintain the magnetron output frequency in agreement with the frequency command signal.

20. An iterative process for mechanically tuning a magnetron according to claim 19, further including the steps of:

supplying said first positioning signal to a digital-to-analog converter to convert digital control signals from said programmable logic device to analog signals;

supplying said analog signals from said digital-to-analog converter to an amplifier to energize said electromechanical device;

storing a dynamically adapting calibration function in said programmable logic device; modifying said dynamically adapting calibration function according to any difference detected between the sensed output signal frequency and the frequency command signal; and generating a second positioning signal with said programmable logic device according to the modified calibration function.

21. An iterative process for mechanically tuning a magnetron according to claim 19 wherein said programmable logic device comprises a microprocessor capable of receiving, storing and manipulating data.

22. An iterative process for mechanically tuning a magnetron according to claim 19 wherein said electromechanical device comprises a linear electric motor.

23. An iterative process for mechanically tuning a magnetron according to claim 19, further including the steps of:

sensing the output frequency of the magnetron with an electromagnetic transducer, said transducer being responsive to the output frequency of the magnetron and producing a signal representative thereof;

supplying the signal representative of the magnetron output frequency to a signal splitter for supplying, from two outputs of said signal splitter, a sample of the magnetron output signal obtained by said electromagnetic transducer;

supplying a first of the two outputs of said signal splitter to the input of a precision gate generator;

connecting a bistable device to said precision gate generator to enable said precision gate generator under control of said programmable logic device;

supplying the second of the two outputs of said signal splitter to a first of two inputs of a frequency downconverter;

connecting the output of an oscillator to the second input of said frequency downconverter, the output signal from said oscillator and the sample magnetron output signal from said signal splitter being mixed by said frequency downconverter to produce an intermediate-frequency signal;

connecting the output of the frequency downconverter to a first of two inputs of a logical AND gate, the second input being connected to the output of said precision gate generator to receive therefrom a signal having a precisely time duration;

connecting the output of said AND gate to a high-speed counter, the output signal of said AND gate having a frequency equal to that of the intermediate-frequency signal and having a duration defining a counting interval and being determined by said precision gate generator;

triggering, with the leading edge of the first pulse of the sample magnetron output signal, said precision gate generator to begin generating the precisely timed output signal that enables said AND gate, the output signal of said precision gate generator also resetting said bistable device, thus prohibiting said precision gate generator from generating another signal until said bistable device is again set under control of said programmable logic means, the output signal of said precision gate generator also acting as an interrupt signal to inform said programmable logic device that said high-speed counter is beginning to count the pulses of the output signal from said AND gate;

counting, with said high-speed counter, the pulses of the output signal from said AND gate during the time said AND gate is enabled, the count being proportional to the frequency of the magnetron output signal; and connecting the output of said high-speed counter to said programmable logic device, said programmable logic device consequently reading the pulse count of said high-speed counter after the completion of the counting interval, the count being a functional measure of the frequency of the magnetron output signal.

24. An iterative process for mechanically tuning a magnetron according to claim 23 wherein said bistable device is a flip-flop.

25. An iterative process for mechanically tuning a magnetron according to claim 23 wherein said programmable logic device is a microprocessor capable of receiving, storing and manipulating data.

26. An iterative process for mechanically tuning a magnetron according to claim 23, further including the step of coupling said signal splitter to said precision gate generator through a detector.

27. An iterative process for mechanically tuning a magnetron according to claim 23 wherein said precision gate generator comprises a precision oscillator and a counter for counting the pulses of said precision oscillator, said precision gate generating an output signal having a duration equal to the time required by said counter to count a preselected number of precision oscillator output pulses.

28. An iterative process for mechanically tuning a magnetron according to claim 27 wherein said precision oscillator has a frequency reference component fabricated of quartz crystal.

29. An iterative process for mechanically tuning a magnetron according to claim 28 wherein the frequency of said precision oscillator is 32 megaHertz.

30. An iterative process for mechanically tuning a magnetron according to claim 23 wherein said oscillator is an ovenized dielectric resonator oscillator.

31. An iterative process for mechanically tuning a magnetron according to claim 30 wherein said oscillator has a frequency reference component fabricated of ceramic.

32. An iterative process for mechanically tuning a magnetron according to claim 31 wherein the frequency of said oscillator is 5.85 gigaHertz.

33. An iterative process for mechanically tuning a magnetron according to claim 23 wherein said microprocessor, said amplifier, said digital-to-analog converter, said high-speed counter, said signal splitter, said precision gate generator, said bistable device, said frequency downconverter, said oscillator connected to said frequency downconverter, said logical AND gate, and said high-speed counter are disposed at distances from the magnetron sufficient to isolate them from high voltage and current transients associated therewith.

34. An iterative process or mechanically tuning a magnetron according to claim 23, further including the step of supplying the pulse count of said high-speed counter to said programmable logic device through a tristate buffer, said programmable logic device reading the pulse count through said buffer subsequent to being interrupted by receiving an output signal from said precision gate generator.

* * * * *